(12) United States Patent
Baker

(10) Patent No.: US 7,916,054 B2
(45) Date of Patent: Mar. 29, 2011

(54) K-DELTA-1-SIGMA MODULATOR

(76) Inventor: R. Jacob Baker, Boise, ID (US)

(*) Notice: Subject to any disclaimer, the term of this patent is extended or adjusted under 35 U.S.C. 154(b) by 0 days.

(21) Appl. No.: 12/436,778

(22) Filed: May 7, 2009

(65) Prior Publication Data

US 2010/0117881 A1 May 13, 2010

Related U.S. Application Data

(60) Provisional application No. 61/112,608, filed on Nov. 7, 2008.

(51) Int. Cl.
*H03M 3/00* (2006.01)

(52) U.S. Cl. ........ 341/143; 341/118; 341/120; 341/122; 341/155; 341/172

(58) Field of Classification Search .......... 341/118–121, 341/143, 155, 172, 141
See application file for complete search history.

(56) References Cited

U.S. PATENT DOCUMENTS

| | | | |
|---|---|---|---|
| 4,439,756 A | | 3/1984 | Shenoi |
| 5,030,954 A | * | 7/1991 | Ribner .......................... 341/172 |
| 5,150,120 A | * | 9/1992 | Yunus ............................ 341/143 |
| 5,274,375 A | * | 12/1993 | Thompson ..................... 341/143 |
| 5,835,044 A | * | 11/1998 | Nishino ........................ 341/143 |
| 5,936,562 A | | 8/1999 | Brooks |
| 5,982,313 A | | 11/1999 | Brooks |
| 5,982,315 A | * | 11/1999 | Bazarjani et al. ............. 341/143 |
| 5,986,598 A | | 11/1999 | Mittel |
| 6,097,325 A | | 8/2000 | Roza |
| 6,172,631 B1 | | 1/2001 | Tsai |
| 6,188,345 B1 | | 2/2001 | McDonald |
| 6,208,279 B1 | * | 3/2001 | Oprescu ........................ 341/143 |
| 6,642,873 B1 | * | 11/2003 | Kuang ........................... 341/143 |
| 6,744,392 B2 | * | 6/2004 | Melanson ...................... 341/143 |
| 6,954,159 B1 | * | 10/2005 | Cooper et al. ................. 341/143 |
| 7,016,421 B2 | * | 3/2006 | Yap et al. ....................... 375/247 |
| 7,196,650 B1 | * | 3/2007 | Hand et al. ..................... 341/155 |
| 7,227,491 B2 | | 6/2007 | Deerer |
| 7,253,759 B1 | | 8/2007 | Kaplan |
| 7,253,761 B1 | * | 8/2007 | Hoyos et al. ................... 341/155 |
| 7,280,066 B2 | | 10/2007 | Pernici et al. |
| 7,319,420 B2 | * | 1/2008 | Nakakita et al. .............. 341/143 |
| 7,561,635 B2 | * | 7/2009 | Norsworthy et al. .......... 375/295 |
| 7,564,391 B2 | * | 7/2009 | Das ................................ 341/144 |

(Continued)

OTHER PUBLICATIONS

Engel Roza Poly-Phase Sigma-Delta Modulation IEEE Transactions on Circuits and Systems-II: Analog and Digital Signal Processing vol. 44 No. 11, Nov. 1997 p. 915-923.

(Continued)

*Primary Examiner* — Linh V Nguyen
(74) *Attorney, Agent, or Firm* — Gerard Carlson

(57) ABSTRACT

A K-Delta-1-Sigma modulator filters or integrates (Sigma) the difference (Delta) between K-feedback paths and an input signal. By using K-feedback paths the topology enables sample rates that are K times the clock frequency of any one feedback path. The sigma block can be implemented in a number of ways including an active or passive integrator or a filter with specific characteristics. When implemented as an integrator, the sigma block is common to all the feedback paths, so that the modulation noise is pushed to a portion of the spectrum where it can be reduced by filtering. The delta block can be implemented in a number of ways including analog adders or switched capacitors.

6 Claims, 10 Drawing Sheets

U.S. PATENT DOCUMENTS

| | | | | |
|---|---|---|---|---|
| 7,619,550 | B2 * | 11/2009 | Maeda et al. | 341/143 |
| 2002/0118128 | A1 * | 8/2002 | Siferd | 341/141 |
| 2006/0227027 | A1 * | 10/2006 | Doerrer et al. | 341/143 |
| 2008/0062024 | A1 * | 3/2008 | Maeda et al. | 341/143 |

OTHER PUBLICATIONS

Ian Galton and Henrik Jensen Oversampling Parallel Delta-Sigma Modulator A/D Conversion IEEE Transaction on Circuits and Systems-II: Analog and Digital Signal Processing vol. 43 No. 12 Dec. 1996 p. 801-810.

Ramin Khoini-Poorfard, Lim and Johns Time Interleaved Oversampling A/D Converters: Theory and Practice IEEE Transactions on Circuits and Systems-II: Analog and Digital Signal Processing, vol. 45 No. 8 Aug. 1997 p. 634-645.

Erik T. King, Eshraghi, Galton and Fiez A Nyquist-Rate Delta-Sigma A/D Converter IEEE Journal of Solid State Circuits, vol. 33, No. 1 Jan. 1998 p. 45-52.

Mucahit Kozak and Izzet Kale Novel Topologies for Timer-Interleaved Delta-Sigma Modulators IEEE Transactions on Circuits and Systems-II: Analog and Digital Signal Processing, vol. 47, No. 7 p. 639-654.

V.T. Nguyen, Loumeau and Naviner Advantages of High-Pass Delta-Sigma Modulators in Interleaved Delta-Sigma A?D Converter Proceedings of the 45th Mid-West Symposium on Circuits and Systems Aug. 4-7, 2002 Tulsa, OK p. I-136-I-139.

A. Eshraghi, and T.S. Fiez A Time Interleaved Parallel Delta-Sigma A/D Converter IEEE Transactions on Circuits and Systems-II Analog and Digital Signal Processing, vol. 50 No. 3 Mar. 2003 p. 118-129.

A. Eshraghi and T.S. Fiez A Comparative Analysis of Parallel Delta-Sigma ADC Architectures IEEE Transactions on Circuits and Systems-I Regular Papers vol. 51 No. 3 Mar. 2004 p. 450-458.

* cited by examiner

K-DELTA-1-SIGMA MODULATOR

CROSS REFERENCE TO RELATED APPLICATIONS

This application claims the benefit of the provisional application entitled "K-Delta-1-Sigma Modulator" by R. Jacob Baker, Ser. No. 61/112,608 filed Nov. 7, 2008, and is hereby incorporated by reference in its entirety.

FEDERALLY SPONSORED RESEARCH OR DEVELOPMENT

Not applicable.

JOINT RESEARCH AGREEMENT

Not applicable

SEQUENCE LISTING

Not applicable

FIELD OF THE INVENTION

The present invention relates to the field of mixed-signal analog and digital design, and in particular to topologies for analog-to-digital conversion and to delta-sigma modulators, also referred to as sigma-delta modulators, using poly-phase sampling sometimes called N-path sampling or time-interleaved sampling.

BACKGROUND

Analog-to-digital converters, or ADCs, convert real world signals such as audio and video to digital signals where they can be processed by digital processors. Common examples include the cell phone where the analog voice of the user is converted for digital processing and transmission. Another example is the video recorder that takes in analog signals representing a picture or scene. The analog-to-digital converter changes these analog signals to digital form for processing and storage.

At a high level, an ADC may be represented by a component with an analog input and a digital output. The analog input represents signals such as voice or video, although countless other representations are possible. The output also represents the input signal but in a digital form of ones and zeros. The speed at which the input changes in time and the accuracy or fidelity of the digital output signal determine the type of ADC needed.

Speed, power consumption, cost and noise are all considerations in the design of analog-to-digital converters. Many types of analog-to-digital converters are in use, each with its owns strengths and weaknesses.

Currently the classic pipelined or Flash analog-to-digital converter (ADC) must operate the ADC clock at the desired sample frequency. Higher sample rates can sometimes be achieved with double clock sampling where parallel ADC stages are clocked on opposite edges of the ADC clock. Other approaches parallel several ADCs. One example of parallel ADCs has eight identical ADCs operating in parallel. While each ADC is clocked at the conversion clock frequency f, the overall conversion rate is eight times f, (8*f). However, even though the bandwidth of the parallel conversion system increases by a factor of 8, the signal-to-noise ratio (SNR) is unaffected at best. In other, non-parallel cases, higher sample rates require higher clock speeds. Higher clock speeds place more constraints on the semiconductor processes, matching of components and post fabrication trimming and calibration.

SUMMARY

The topology disclosed herein is called a K-Delta-1-Sigma Modulator. The K-Delta-1-Sigma Modulator employs averaging and parallelism. This results in both higher bandwidth and improved signal-to-noise ratio (SNR). This feature and its advantages distinguished the K-Delta-1-Sigma modulator from simple parallel converter arrangements. The K-Delta-1-Sigma Modulator has a number of interconnected blocks. In one embodiment a delta block subtracts K feedback paths from the input signal. The designation "K" in this disclosure is a number of two or greater. For example, if K equals four, the delta block subtracts four feedback paths from the input signal. The output of the delta block is an analog signal called the analog output. Another block called the sigma block receives the analog output from the delta block and filters it in some way. Many types of filters are possible including single and multi-pole filters implemented as low pass, band pass, and high pass. An integrator can also be one of the sigma block types. In the K-Delta-1-Sigma Modulator, there is a single sigma block, hence the designation K-Delta-1-Sigma.

The output of the sigma block is called the filtered output. The filtered output is the time interleaved average of the input to the sigma block. The filtered output is received by K quantizers. A quantizer is a device that receives an analog input and produces a digital output. The digital output from each quantizer can be a single bit representing a one or zero. The digital output from each quantizer can also be a number of bits, depending upon the quantizer type. As a result, the K quantizers produce K digital outputs. Each of the K digital outputs feeds into a corresponding one of K digital-to-analog converters. The output of each of the K digital-to-analog converters is a feedback path introduced earlier. In total there are K feedback paths.

The K quantizers are clocked by individual phases of a main clock frequency fs. While each phase is the same frequency of the main clock, the active portion of each phase does not coincide with the active portions of the other phases, but rather they are shifted from adjacent phases by 1/(K*fs). The effective sampling rate of the topology is therefore K times fs. The result is a sampling rate of K times fs while all clocks are limited in frequency to fs. This reduces the design and manufacturing constraints on mixed-signal designs such as analog-to-digital converters (ADCs).

Further processing is available for the K digital outputs from the K quantizers. Such processing can be decimation, summation, scaling, truncation or digital filtering. Some embodiments may employ a digital multiplexer which sequentially switches the outputs of the K quantizers onto a single digital output. This embodiment provides a temporal sequence of ones and zeros that reflect the value of the analog input.

Some embodiments of the topology allow the analog sections of the topology to operate at fs while the digital sections operate at higher speeds such as K times fs. This is advantageous because it is typically easier to design high speed digital systems than it is to design accurate, high speed analog systems. Additionally, lower clock speeds allow the use of larger, slower and less expensive semiconductor processes.

In one embodiment the delta block is implemented by a switch capacitor network. The various phases of the clock alternately charge K capacitors to the value of a corresponding feedback path and then switch them to subtract that value from the input signal.

In some embodiments a gain block or amplifier is interposed between the output of the sigma block and the inputs of the K quantizers. The amplifier or gain stage can provide voltage gain, current gain or both. Depending upon the signal paths employed in the K-Delta-1-Sigma Modulator, the amplifier or gain stage can be single ended or differential. This additional gain improves the topology's tolerance to offsets, response time and component variations. The amplifier or gain stage acts as a quantizer pre-amplifier. Since the speed of the quantizers can be a factor in the performance of the K-Delta-1-Sigma Modulator, the amplifier may improve performance in some applications.

In some embodiments, delays are added to various clock phases to improve the overall operation and stability of the K-Delta-1-Sigma Modulator.

Appropriate delays, inserted in various phases of the clock, compensate for the speed of various K-Delta-1-Sigma Modulator components. Delays are useful for example when improving the operation of clocked quantizers or switch capacitor networks.

In other embodiments, multiple K-Delta-1-Sigma stages can be cascaded for improved performance. Advantages include higher sampling rates and the ability to further randomize noise and avoid tones in the output spectrum. In addition to cascaded configurations, parallel configurations are also possible.

BRIEF DESCRIPTION OF DRAWINGS

The summary above and the following detailed description will be better understood in view of the enclosed drawings which depict details of various embodiments. Like reference numbers designate like elements. It should however be noted that the invention is not limited to the precise arrangement shown in the drawings. The features, functions and advantages can be achieved independently in various embodiments of the claimed invention or may be combined in yet other embodiments.

DETAILED DESCRIPTION

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention, and it is to be understood that modification to the various disclosed embodiments may be made and other embodiments may be utilized, without departing from the spirit and scope of the present invention. The following detailed description is therefore, not to be taken in a limiting sense.

Figure 1:
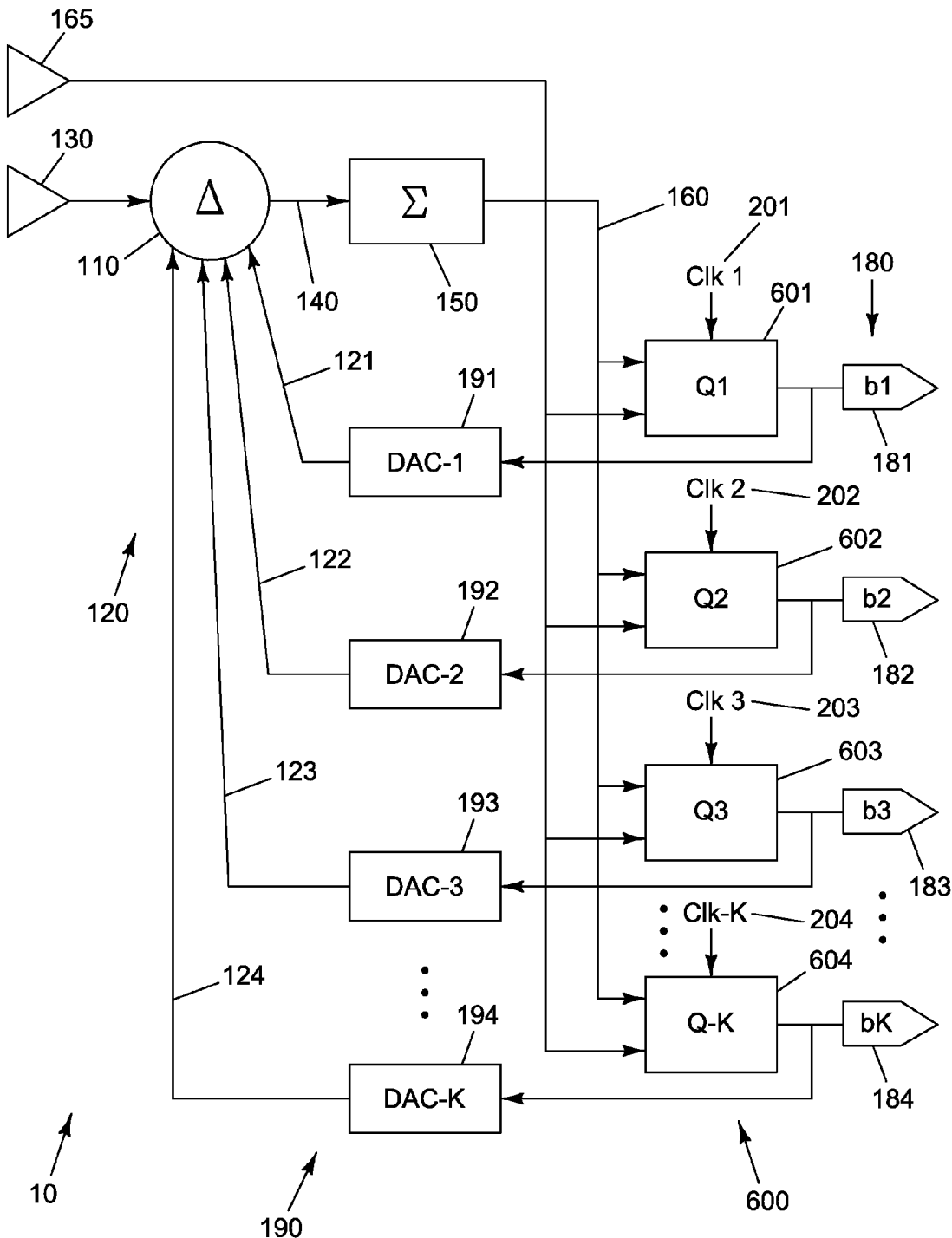
FIG. 1 shows one embodiment of the K-Delta-1-Sigma Modulator.

FIG. 1 shows one embodiment of the K-Delta-1-Sigma Modulator 10. Feedback paths 120 subtract from the analog input 130 in the delta block 110. The individual feedback paths 121, 122, 123, and 124 are collectively referred to as the K feedback paths 120. In FIG. 1, while four feedback paths are shown, the ellipses indicate that the value of K, the number of feedback paths, may vary depending upon the particular embodiment. The analog output 140 of the delta block 110 feeds into the sigma block 150. The single sigma block 150 is the "1" of the K-Delta-1-Sigma Modulator 10. The sigma block 150 can take many forms. The sigma block 150 can be a first order (one pole) or higher order circuit (multi-pole). In one embodiment the sigma block 150 is an integrator. In other embodiments the sigma block 150 is a band pass or other type of filter. The functions of the sigma block 150 can be implemented with active or passive circuits. For example, a band pass filter can be implemented with a capacitor-inductor tank circuit or an active filter circuit.

The sigma block 150 produces a filtered output 160. The filtered output 160 feeds the inputs of K quantizers 600. Individually the K quantizers are referenced as 601, 602, 603 and 604. The reference signal 165 acts as a reference for the K quantizers 600. In embodiments where the analog input 130 and subsequent internal signals are differential signals, the reference signal 165 would not be needed. Each of the K quantizers 600 receives the filtered output 160 and produces one of the K digital outputs 181-184.

The K quantizers 600 are each clocked by an individual clock. Clk 1 indicated by 201 clocks quantizer 601, Clk 2 indicated by 202 clocks quantizer 602, Clk 3 indicated by 203 clocks quantizer 603, Clk K indicated by 204 clocks quantizer 604. A more detailed description of Clk 1, Clk 2, Clk 3 and Clk 4 follow in the description of FIG. 2.

The outputs of the four quantizers 601, 602, 603 and 604 are four digital outputs 181, 182, 183 and 184 collectively referred to as the digital outputs 180. The digital outputs 180 can each be a single bit or a multi-bit output depending upon the design of the quantizer. For example if digital output 181 was a single bit it would have a value of one or zero. The K quantizers 600 can also be K analog-to-digital converters each with multiple output bits. If, for example, digital output 181 was a two-bit quantity, the values would be binary encoded and range in value from zero (00) to three (11). In some embodiments each of the digital outputs 180 has the same number of bits and the same range of values. In the embodiments FIG. 1 there is not a sense of one digital output 180, 181, 182, or 184 being more significant than another.

The K digital outputs 180 feed into digital-to-analog converters 190. Each digital output 181-184 feeds into a respective digital-to-analog converter 191-194. The digital-to-analog converters 190 are matched to the digital outputs 180 in that each digital-to-analog converter 191-194 inputs all the bits of its respective digital output 181-184. The outputs of the digital-to-analog converters are the K feedback paths 120 described previously.

Figure 2:
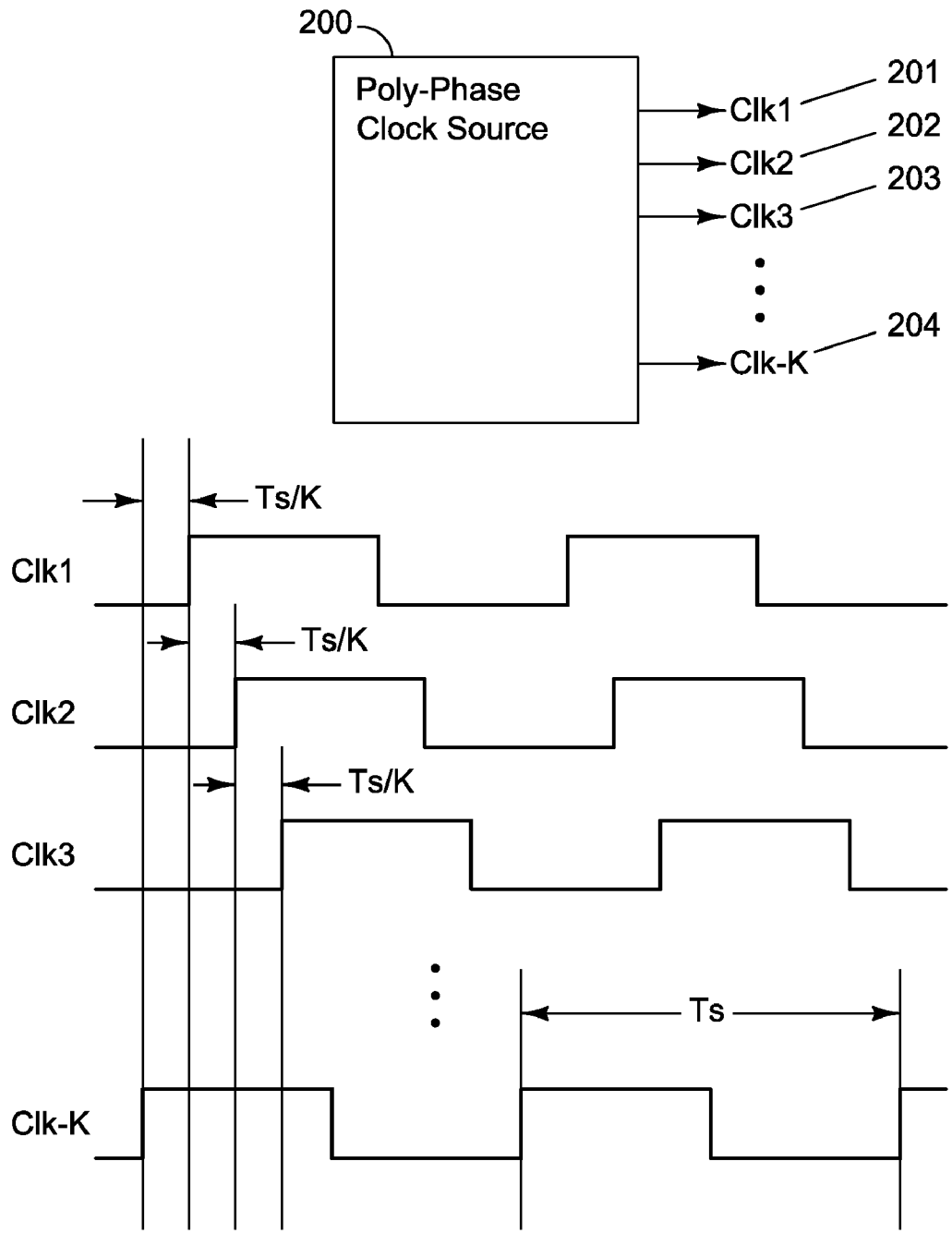
FIG. 2 shows one embodiment of a poly-phase clock source with K output clock phases.

FIG. 2 shows one example of the clocks 201, 202, 203, 204 of FIG. 1. The clock source 200, also known as a poly-phase clock source, generates the K clocks. In FIG. 2, while four clocks are shown, the ellipses indicate that the value of K, the number of clocks, may vary depending upon the particular embodiment. The period of each clock is Ts as shown in the waveform of FIG. 2. The frequency of each clock is (1/Ts)=fs. In one embodiment, the active edge of each clock phase is delayed Ts/K from the previous clock. For example, if fs=100 MHz, Ts=1/100 MHz or 10 nanoseconds (nS). With four feedback paths (K=4) each clock phase is delayed up to 10/4 or 2.5 nS from the previous phase. These clocks enable the K-Delta-1-Sigma Modulator to have a sampling rate of 1/(K*fs) or 2.5 nS in this example. This topology enables the major part of the circuit to run at a lower frequency of fs while still providing a sample rate of K*fs.

Poly-phase clock source 200 can generate clocks 201-204 in a number of ways known to those skilled in the art. In one embodiment, the clock phases 201-204 are generated with a ring oscillator. The ring oscillator depends upon the delay through a chain of inverters. Inverters are one of the simplest components and can be made to operate at high speeds giving fast sample times. Other embodiments of poly-phase clock source 200 include delay locked loops and phase locked loops or any circuit that can generate multiple phases of a clock signal.

Figure 3:
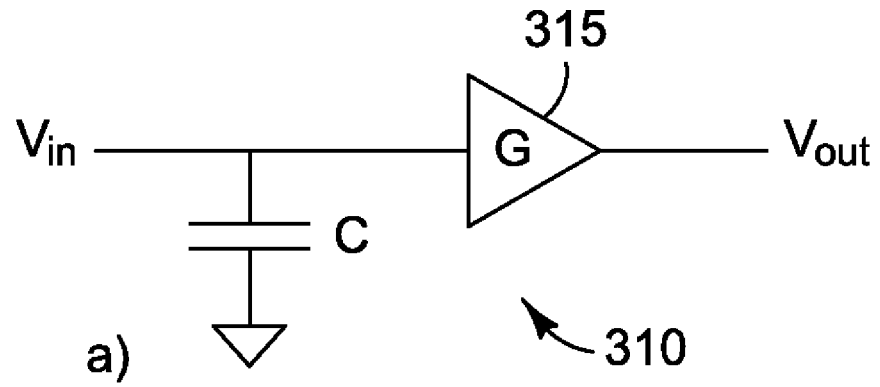
FIG. 3 shows three embodiments of an integrator.
Figure 3:
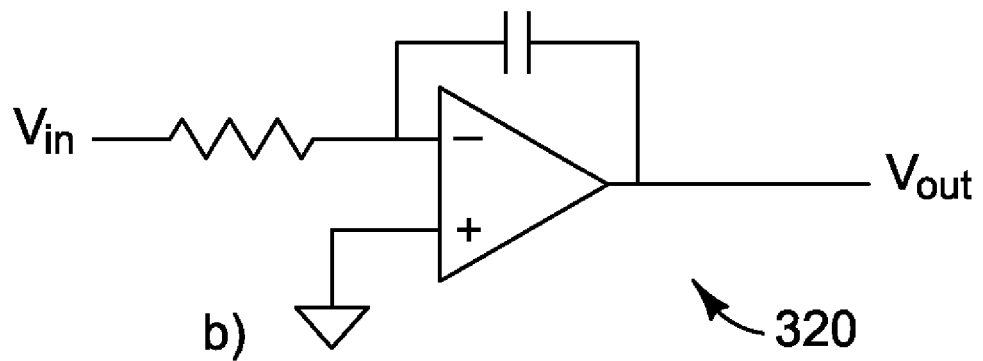
Figure 3:
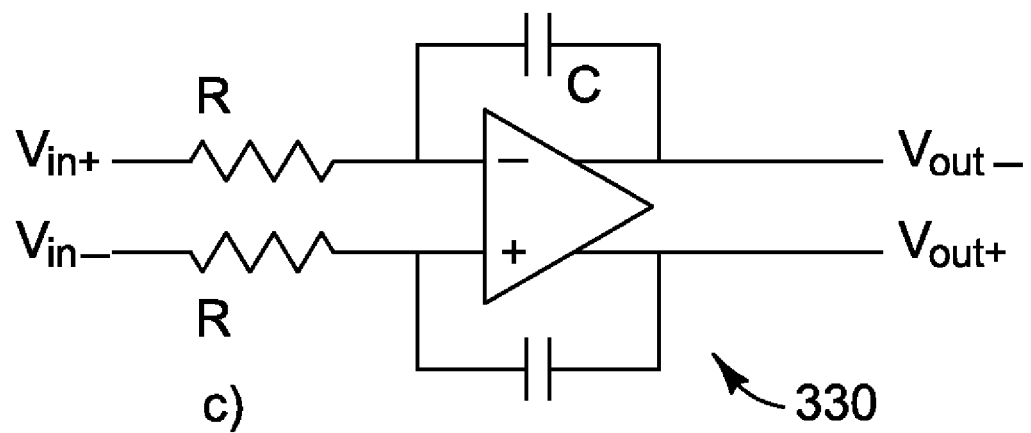

FIG. 3 shows three possible embodiments of the sigma block 150 of FIG. 1. FIG. 3a shows an integrator 310 made of a capacitor C and a gain block 315. FIG. 3b shows an active integrator 320 using an operational amplifier. FIG. 3c depicts a differential integrator 330 based on an operational amplifier. In FIGS. 3a and 3b, the Vin input receives the analog output 140 of FIG. 1 and the Vout signal drives the filtered output 160 of FIG. 1. Other possible configurations include two or more integrators together to form a cascaded series of integrators. The subtraction or delta function of the K-Delta-1-Sigma modulator can be incorporated in some embodiments using resistor adders or switched-capacitors. Thus, the integrator can be a continuous-time or discrete-time version. The switched-capacitor embodiment will be discussed in more detail.

Figure 4:
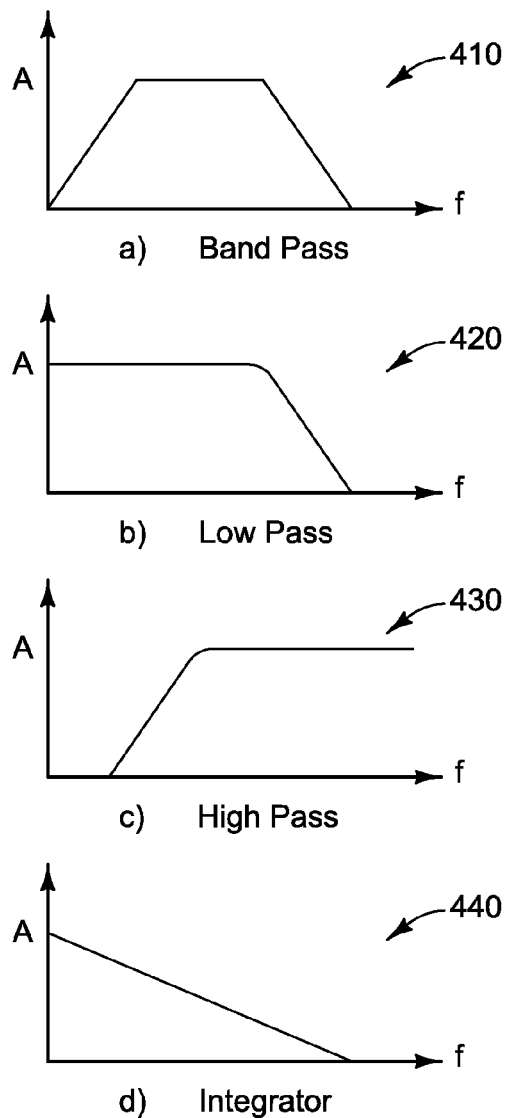
FIG. 4 shows four examples of filter transfer functions.

FIG. 4 shows other possible embodiments of the sigma block 150 of FIG. 1. Some embodiments of the K-Delta-1-Sigma Modulator 10 of FIG. 1 include the sigma block 150 implemented with various filters. Four filters are shown in FIG. 4 each represented by their amplitude versus frequency response curves. Example filters include a band pass filter 410 in FIG. 4a, a low pass filter 420 in FIG. 4b and a high pass filter 430 in FIG. 4c. FIG. 4d shows an integrator 440, represented by its amplitude versus frequency response.

Figure 5:
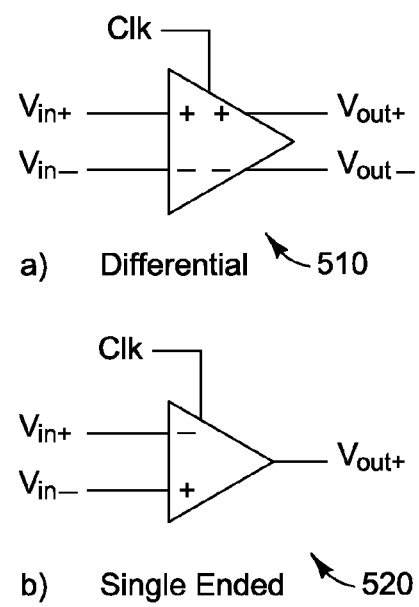
FIG. 5 shows two examples of clocked comparators.

FIG. 5 shows another embodiment for the quantizers 600 of FIG. 1. FIG. 5a shows a single bit differential clocked comparator 510 while FIG. 5b shows a single bit single ended clocked comparator 520. In either comparator, the output will be a one if Vin+ exceeds Vin− at the time of the clock input Clk. Depending upon design, the quantizer output can switch on the edge of the Clk or on a level of Clk. There are several advantages of using clocked comparators for the quantizers 600 of FIG. 1. One advantage is that clocked comparators are simple circuit elements consuming little power or circuit area. Another advantage is their high speed. Yet another advantage is that comparators act as both analog-to-digital converters and digital-to-analog converters at the same time. The clocked comparators 510 and 520 receive and compare two analog voltages at Vin+ and Vin− and make a comparison producing a high or a low digital output at Vout. This is essentially an analog-to-digital conversion process. When the output of the comparator is controlled to be either a specific value for a one output, or a specific value for a zero output, this is essentially a single bit digital-to-analog converter. Thus a clocked comparator of the type shown in FIG. 5 can serve the function of both the quantizer such as 601 and the digital-to-analog converter such as 191 of FIG. 1. The digital output of the clocked comparator can serve as both the digital output 181 and the feedback path 121 of FIG. 1.

Figure 6:
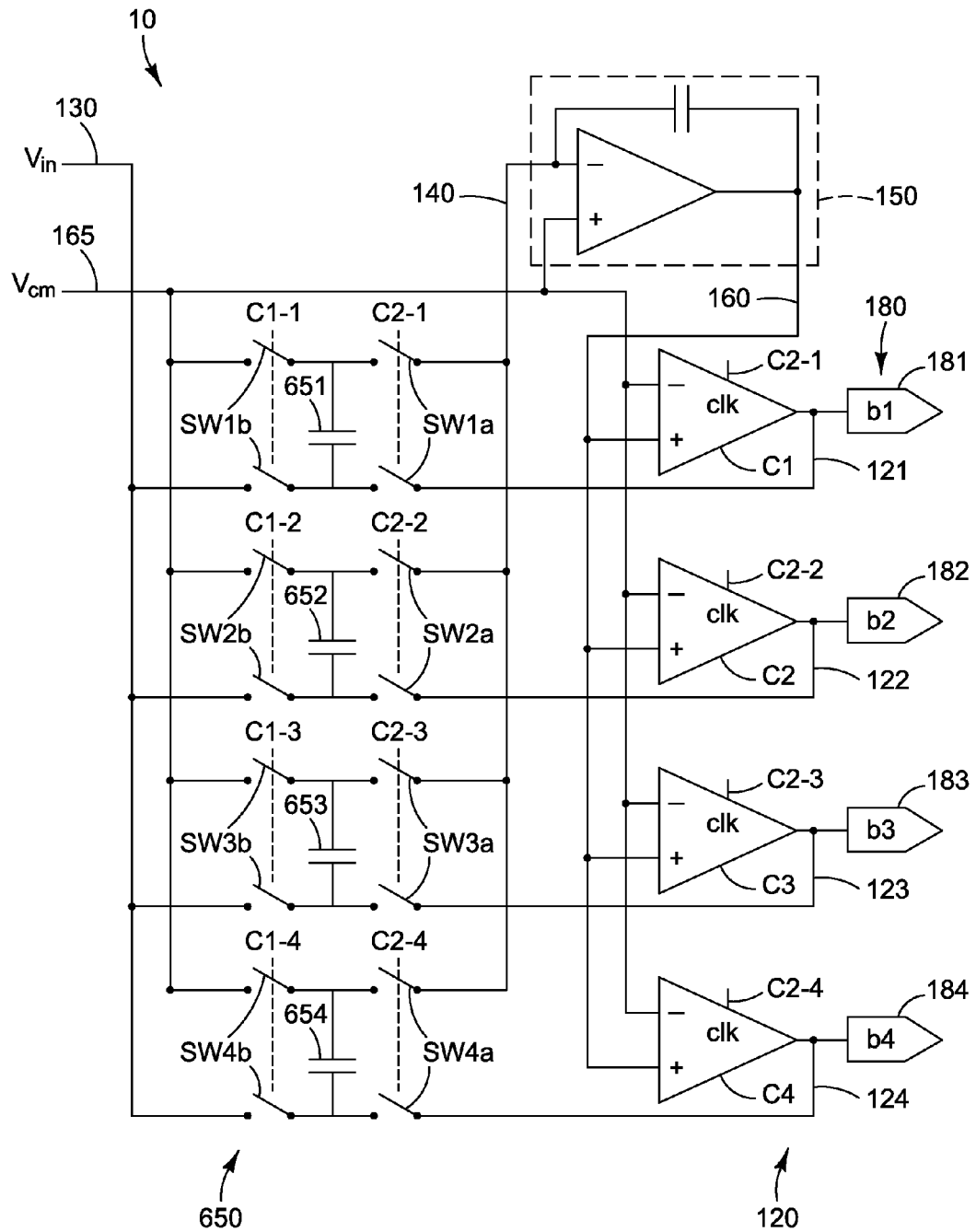
FIG. 6 shows one embodiment of a K-Delta-1-Sigma Modulator using a switched-capacitor network of K switched-capacitors.
Figure 7:
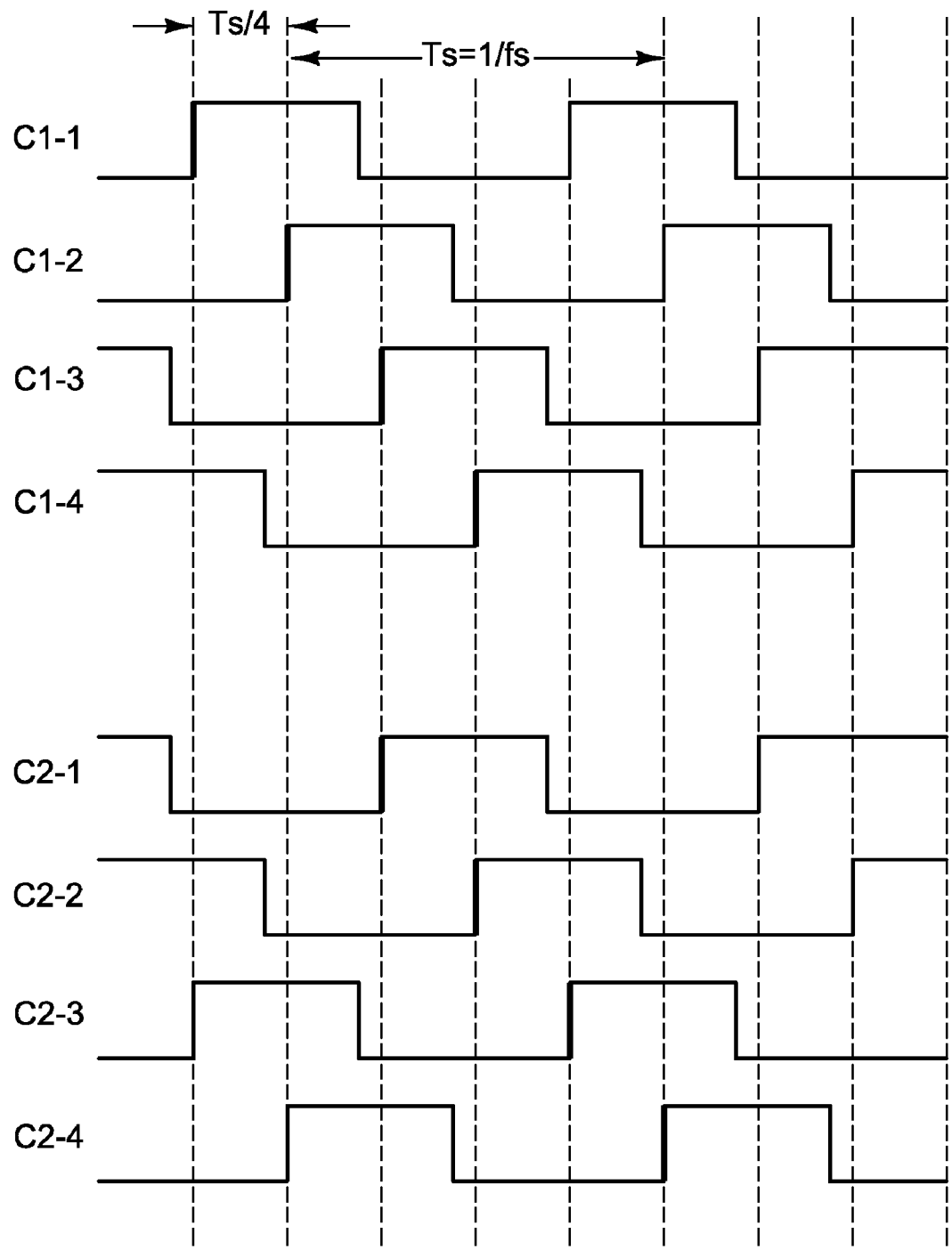
FIG. 7 shows a timing diagram of clocks from a poly-phase clock source.

FIG. 6 shows an embodiment of the K-Delta-1-Sigma Modulator using switched-capacitors. FIG. 6 shows a circuit where K=4. The delta block 110 of FIG. 1 is realized with the switched-capacitor network 650 of K switched-capacitors. The sigma block 150 of FIG. 1 is implemented with the active integrator of FIG. 3b. The quantizers are K clocked comparators implemented with the clocked comparators 520 of FIG. 5. The K clocked comparators each receive the filtered output 160 to produce a plurality of K one bit feedback paths 120. Note however in this embodiment, additional use of the clock phases to operate the switched-capacitor network 650. FIG. 7 shows the details of the clocks in FIG. 6 for a switched-capacitor K-Delta-1-Sigma Modulator where K=4.

The operation of the K-Delta-1-Sigma modulator of FIG. 6 follows. During the high portion of C1-1, the switch SW1b is closed and the capacitor 651 is connected to the analog input 130 and reference 165. This connection charges the capacitor 651 to the difference between the voltage at the analog input 130 and the voltage of the reference 165. The filtered output 160 from the sigma block 150 feeds the four clocked comparators C1-C4. At clocked comparator C1 the filtered output 160 is compared against a reference 165. At the rising edge of the clock C2-1, the comparator outputs and holds the result of the comparison at the digital output 181. During the high portion of clock C2-1, the switch SW1a closes and places the voltage at digital output 181 in series with the voltage of the analog input stored on capacitor 651. The resulting voltage is the analog output 140 which is the difference between the analog input 130 and the feedback path 121. The value on the analog output 140 is added to the accumulated sum in the integrator of the sigma block 150. The output of the sigma block 150 is the filtered output 160 which is fed into the clocked comparators as described previously.

The process described above, is applied sequentially to all four capacitors 651, 652, 653 and 654. The process can be summarized as charging a capacitor to the analog input voltage and then switching the capacitor in series with one of the four feedback paths 121, 122, 123, or 124 to produce an analog output 140 which is then input to the sigma block 150. The clock waveforms of FIG. 7 work to sequentially charge the capacitors from the analog input 130, place them in series with one of the feedback paths 121-124 and providing the resulting difference to the integrator of the sigma block 150.

In FIG. 6 each of the switches, indicated as a double pole/single throw, is closed when its associated clock phase is high as follows: SW1a with C2-1, SW1b with C1-1, SW2a with C2-2, SW2b with C1-2, SW3a with C2-3, SW3b with C1-3, SW4a with C2-4 and SW4b with C1-4.

FIG. 7 shows the output of a poly-phase clock source with two sets of K non-overlapping phases where K=4. While in FIG. 7 some clocks are duplicates of each other, in some embodiments the phases of the clocks may be adjusted slightly to compensate for the delays of comparators or other components. Minor adjustment of phases, in some cases, can improve the performance of the K-Delta-1-Sigma modulator.

Each clock waveform C1-1, C1-2, C1-3 and C1-4 of FIG. 7 has a period of Ts. Similarly each clock waveform C2-1, C2-2, C2-3 and C2-4 of FIG. 7 has a period of Ts. This gives a clock frequency of (1/Ts) or fs for each of the waveforms. However because there are four phases within each period of Ts, the effective period is Ts/4 for an effective frequency of 4*(1/Ts) or 4*fs. The result is that the K-Delta-1-Sigma Modulator has a sampling frequency of K times the frequency of any one clock. More generally, referring to FIG. 1, as the value of K is increased, the number of quantizers, feedback paths and digital-to-analog converters is increased. However, as the value of K increases the frequency of any one clock does not increase even though the effective sampling rate is multiplied by K. Also, because of the filtering of the sigma block the signal-to-noise ratio is improved over simply operating K analog-to-digital converters in parallel.

While FIG. 6 uses a value of K=4, other values are possible. Note also that some other topologies are best suited to K values which are powers of 2 such as 4, 8 or 16, etc. The K-Delta-1-Sigma Modulator however does not have this restriction and can just as easily be built with non-power of 2 values. This feature can save circuit complexity, for example, when a value of K=6 is adequate.

Figure 8:
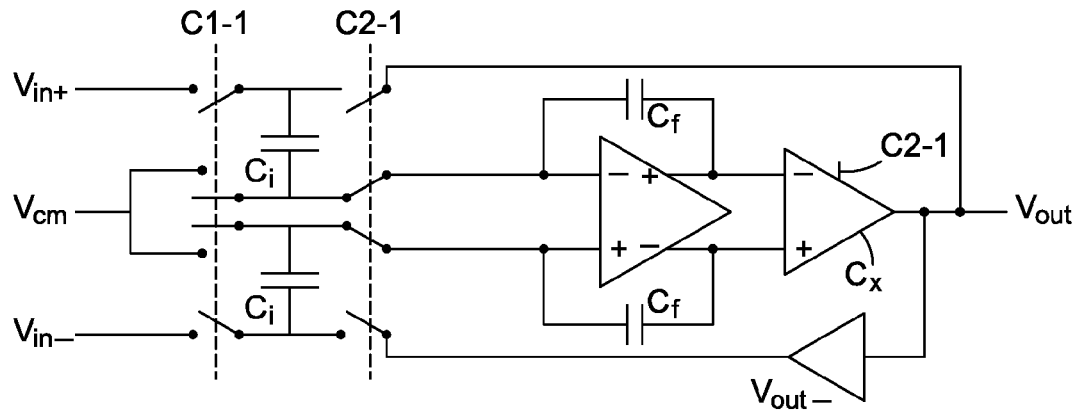
FIG. 8 shows one embodiment of a differential input, switched-capacitor implementation of a K-Delta-1-Sigma section.

FIG. 8 shows a differential segment of a K-Delta-1-Sigma modulator implemented with a switched-capacitor network with capacitors Ci. Clock phases C1-1 and C2-1 control two sets of switches. An operational amplifier with two integrating capacitors Cf forms the Sigma block in this implementation. A comparator Cx serves as the quantizer and digital-to-analog converter.

Figure 9:
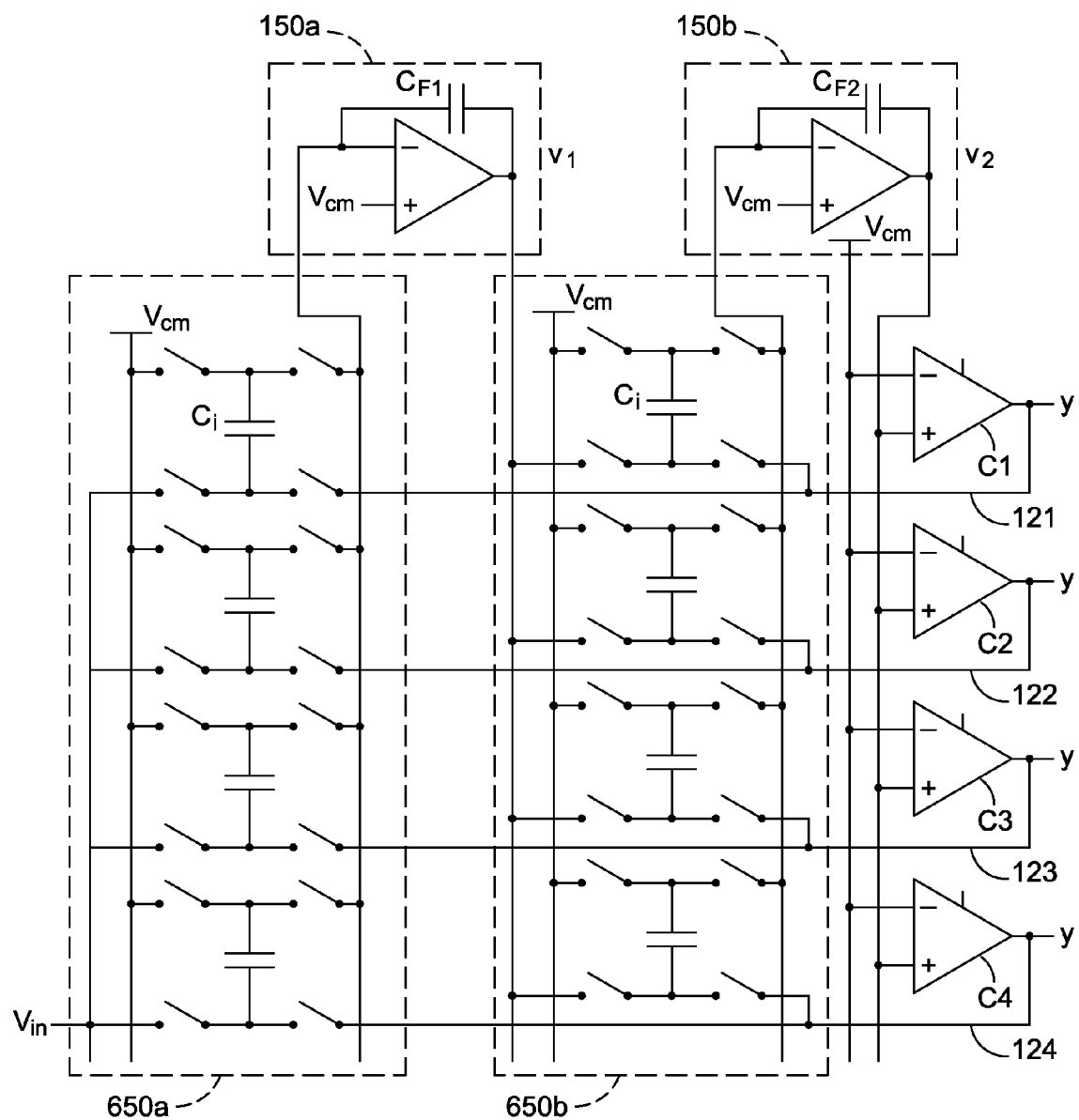
FIG. 9 shows an embodiment employing cascaded K-Delta-1-Sigma stages.

FIG. 9 shows an embodiment based on two cascaded stages of the K-Delta-1-Sigma modulator of FIG. 6. In this embodiment the first switched-capacitor network 650a works together with the sigma block integrator 150a to form the first stage. A second switched-capacitor network 650b works together with a second sigma block integrator 150b to form the second stage. The comparators C1, C2, C3, and C4 generate the K feedback paths 121, 122, 123, and 124. Cascaded versions of the K-Delta-1-Sigma modulator improve the overall signal-to-noise ratio (SNR). Other advantages include the randomization of noise and reduction of tones in the output spectrum.

Figure 10:
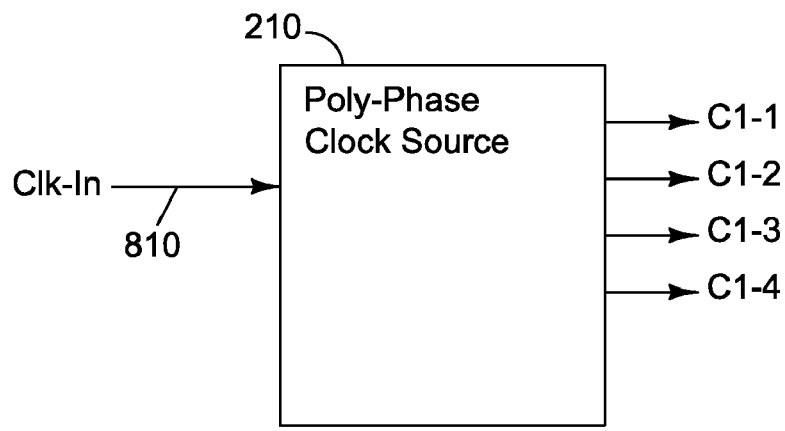
FIG. 10 shows a one embodiment of a poly-phase clock source.

FIG. 10 shows an embodiment of the poly-phase clock source 210. In this implementation an external clock Clk-In 810 feeds the poly-phase clock source 210. Internally the poly-phase clock source 210 generates the clocks C1-1, C1-2, C1-3 and C1-4 of FIG. 7. The poly-phase clock source 210 may be a delay locked loop (DLL), a phase locked loop (PLL) or some other circuit, known to those skilled in the art that generates multiple phases of a clock.

Figure 11:
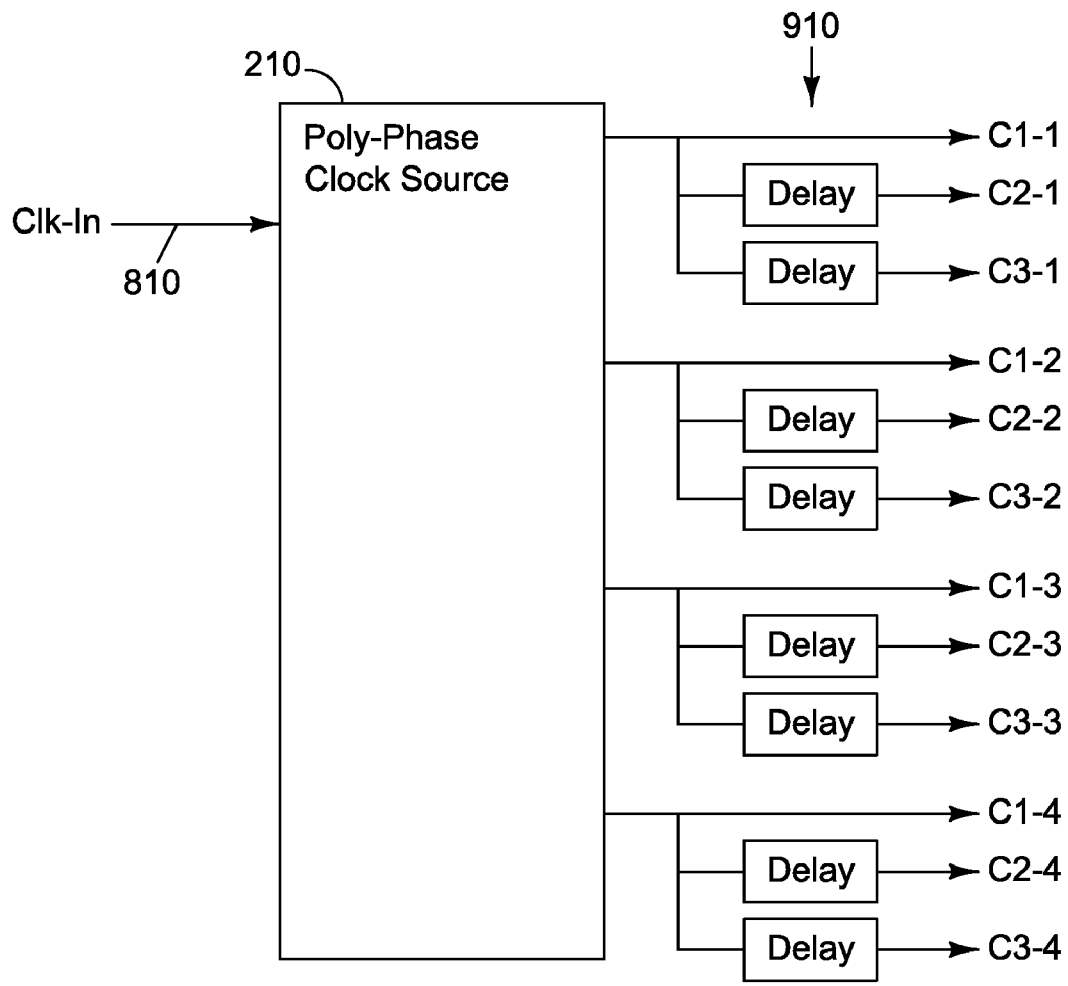
FIG. 11 shows one embodiment of a poly-phase clock source with delays added to various clock phases.

FIG. 11 shows another embodiment of the poly-phase clock source 210. In this implementation various delays 910 have been added to the outputs of poly-phase clock source 210 to generate additional delayed clocks C2-1-C2-4 and C3-1-C3-4. The appropriate choice of delayed clocks can be chosen to compensate for delays in various components of the K-Delta-1-Sigma Modulator. The delays shown in FIG. 11 do not need to be of the same value but are chosen based on the needs of the particular implementation of the K-Delta-1-Sigma Modulator.

While the K-Delta-1-Sigma Modulator can exhibit limit cycle oscillations, these can be controlled by several methods. One method is to design the sigma block without excess phase shift. Another method is to also design the quantizers without excess phase shift. Yet another is to adjust the phases clocking the quantizers to compensate for the quantizer delay. Still another method is to use the digital filtering of the output as discussed below. These methods may be used singly or in combination to reduce the amplitude of limit cycle oscillation.

Figure 12:
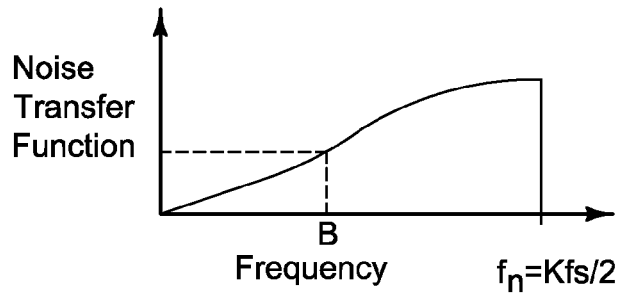
FIG. 12 shows an application employing low pass filtering of the K-Delta-1-Sigma output.

FIG. 12 is an example plot of modulation noise transfer function (NTF) versus frequency. As the number of feedback paths K, of the K-Delta-1-Sigma modulator increases, the modulation noise is pushed to higher frequencies (K*fs)/2. This is advantageous when the required bandwidth is less as indicated by B on the plot. In such cases a filter can be used to limit the K-Delta-1-Sigma output bandwidth and hence the noise. In FIG. 12, the dotted box represents a sharp cutoff, low pass filter. The noise to the right of the filter is removed from the modulator output. This improves the signal-to-noise ratio. The low pass filter of FIG. 12 can be in digital form and is discussed below.

Figure 13:
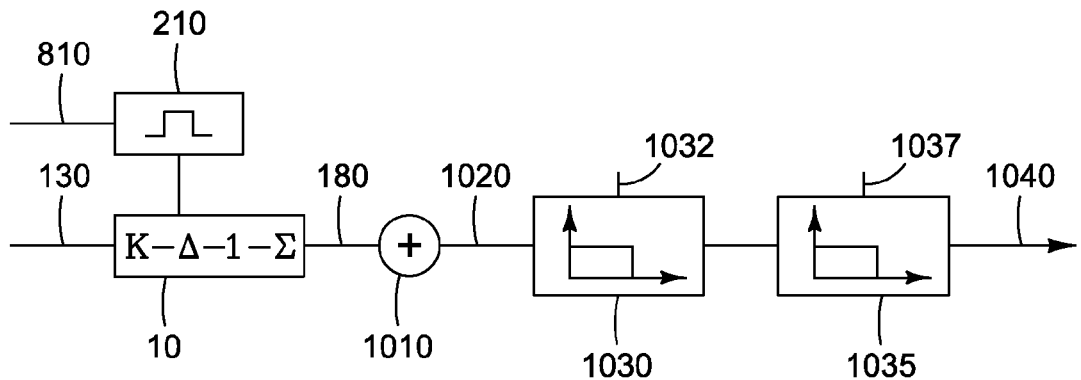
FIG. 13 shows a block diagram of one embodiment of the K-Delta-1-Sigma Modulator with the poly-phase clock source and digital filtering.

FIG. 13 shows a K-Delta-1-Sigma Modulator which includes digital signal processing of the digital outputs 180. In FIG. 13 the analog input 130 feeds into the K-Delta-1-Sigma Modulator of FIG. 1 or 6. The digital outputs 180 are summed by a digital adder 1010 producing a summed digital output 1020. The digital adder 1010 can be purely combinational in nature or can include registers to clock and hold the digital outputs 180 to provide decimation of the digital outputs 180. The summed digital output 1020 can be further filtered in the digital domain by digital filters 1030 and 1035 to produce a filtered digital output 1040. The digital filters can have digital clock sources 1032 and 1037 which are independent of, or asynchronous to, the clock 810 which drives the poly-phase clock source 210. In other embodiments the clocks 210, 1032 and 1035 could be the same or synchronous with respect to each other. In still other embodiments the poly-phase clock source 210 of FIG. 10 with its external clock 810 can be replaced by the poly-phase clock source 200 of FIG. 2 which does not require an external clock. The frequencies of the digital clock sources 1032 and 1037 can be chosen to provide decimation, interpolation as well as determining filter characteristics.

The digital outputs labeled b1 though bK in FIG. 1 and b1 though b4 in FIG. 6 are further processed in the digital domain. The outputs in FIG. 1 can be multi-bit outputs while each of the outputs 180 in FIG. 6 has a binary value of one or zero. In FIG. 6 the outputs 180 also serve as one bit feedback paths 120. One embodiment uses a multiplexer to multiplex the K one bit feedback paths onto a single output. Each bit of FIG. 6 has the same binary weight and does not represent a power of two as in some binary outputs. Other embodiments total the number of ones among the outputs b1 through b4 in FIG. 6 to generate a standard binary value. For example an adder, also called a summer, to total the number of ones will have the following truth table:

| b1 | b2 | b3 | b4 | Bit Summer Output |
|---|---|---|---|---|
| 0 | 0 | 0 | 0 | 000 |
| 0 | 0 | 0 | 1 | 001 |
| 0 | 0 | 1 | 0 | 001 |
| 0 | 0 | 1 | 1 | 010 |
| 0 | 1 | 0 | 0 | 001 |
| 0 | 1 | 0 | 1 | 010 |
| 0 | 1 | 1 | 0 | 010 |
| 0 | 1 | 1 | 1 | 011 |
| 1 | 0 | 0 | 0 | 001 |
| 1 | 0 | 0 | 1 | 010 |
| 1 | 0 | 1 | 0 | 010 |
| 1 | 0 | 1 | 1 | 011 |

| b1 | b2 | b3 | b4 | Bit Summer Output |
|----|----|----|----|-------------------|
| 1  | 1  | 0  | 0  | 010               |
| 1  | 1  | 0  | 1  | 011               |
| 1  | 1  | 1  | 0  | 011               |
| 1  | 1  | 1  | 1  | 100               |

Output table for K = 4

The outputs from the bit summer described above can be further filtered in the digital domain. Digital filters such as FIR or IIR with a number of filter transfer functions can reduce the quantization noise associated with sampled systems. These digital filters can be very helpful in cases where only a certain spectrum of the input signal is of interest. In some embodiments the analog sections of the K-Delta-1-Sigma modulator are operated at the clock frequency of fs while the digital domain of counters and digital filters is operated at a higher clock frequency such as K*fs. Together with pass band type sigma blocks, the topology lends itself to demodulation of broadband signals. Applications include digital radio and other radio frequency communication.

With an effective sampling frequency of K*fs, the quantization noise can be considered to fall into a spectrum with an upper limit of (K*fs)/2, the Nyquist frequency. The advantage here is that the noise is spread over a larger spectrum than the fs sampling rate and therefore has a lower amplitude for a given frequency band. This lowering of noise results in a higher signal-to-noise ratio (SNR).

Figure 14:
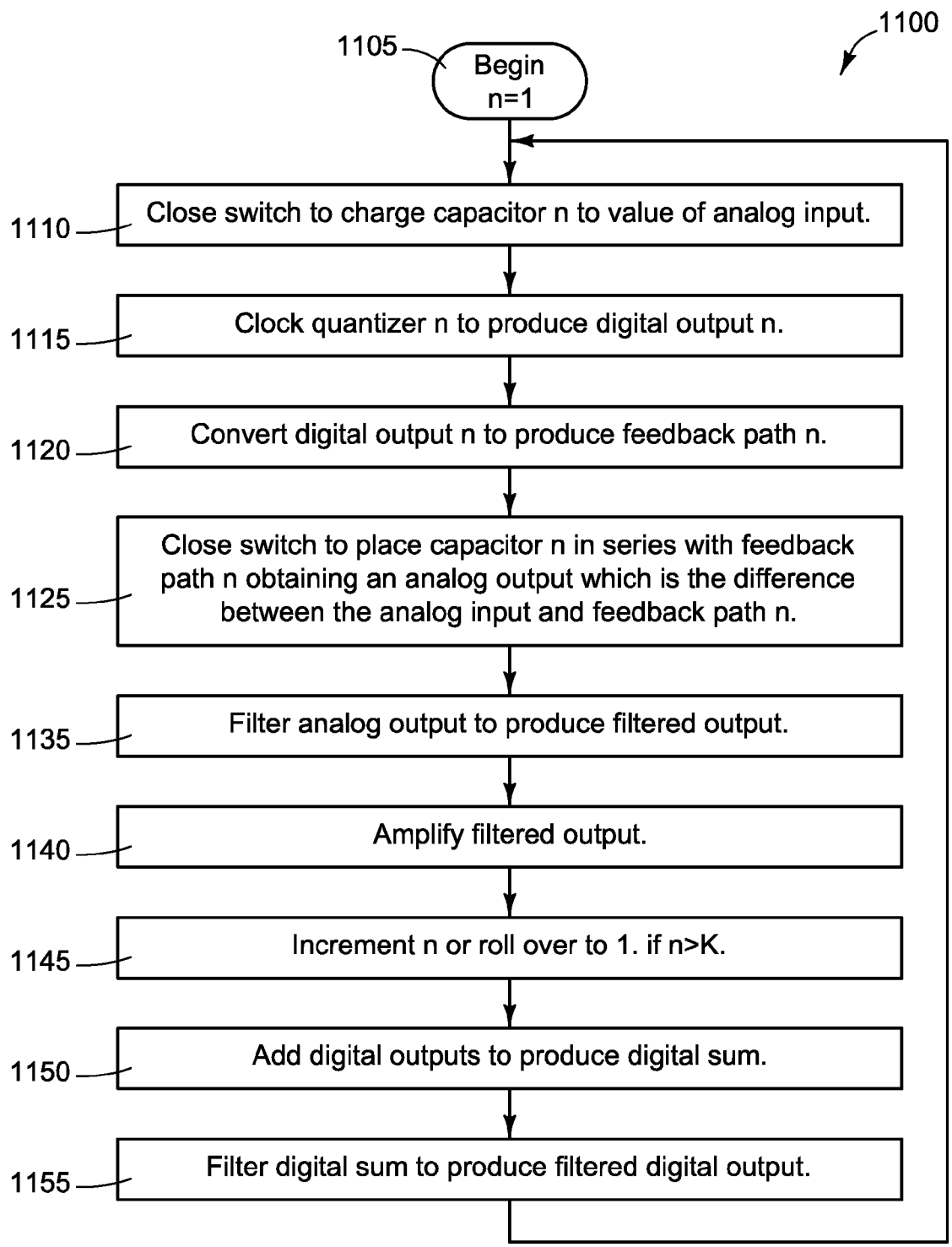
FIG. 14 is a flow chart depicting one embodiment of a method for implementing the K-Delta-1-Sigma Modulator.

FIG. 14 is a flow chart 1100 of one embodiment of a method to implement the K-Delta-1-Sigma Modulator with switched-capacitors. The method begins at 1105 with an initial value for a loop index n=1. At 1110, n=1 and a first capacitor is charged to the analog input voltage by activating an appropriate switch. At 1115, quantizer n is clocked to produce digital output n. At 1120, the digital output from quantizer n is converted to an analog voltage to produce a feedback path n. At 1125 capacitor n is switched in series with feedback path n obtaining an analog output which is the difference between the analog input and feedback path n. At 1135 the analog output is filtered to produce a filtered output. At 1140 the filtered output is amplified. At 1145 the value of n is incremented by one or rolled over to 1 if the incremented value exceeds K, the number of the K-Delta-1-Sigma Modulator. At 1150 the digital outputs are added to produce a digital sum. The digital sum is used directly or filtered at 1155 to produce a filtered digital output representing the analog input.

The method 1100 repeats charging each of the K capacitors from the analog input and then sequentially switching each of the capacitors in series with the respective feedback path and to produce the analog output. A poly-phase clock source produces a set of non-overlapping phases to control the charging and switching of the capacitors. The analog output is filtered to produce a filtered output. The filtered output is quantized to produce K digital outputs. The K digital outputs are converted to the K feedback paths. The K digital outputs are added to produce a summed digital output. The summed digital output is filtered to produce a filtered digital output.

Those skilled in the art will recognize that the operations in the flow chart 1100 do not necessarily need to be performed in the order shown. Some operations may be omitted while others may be performed in parallel.

Although this invention has been described in terms of certain embodiments, other embodiments that are apparent to those of ordinary skill in the art, including embodiments that do not provide all of the features and advantages set forth herein, are also within the scope of this invention. Rather, the scope of the present invention is defined only by reference to the appended claims and equivalents thereof.

What is claimed is:

1. A K-Delta-1-Sigma Modulator to process an analog input, the K-Delta-1-Sigma Modulator comprising:
   a delta block of switched capacitors sequentially subtracting a plurality of K feedback paths, K being an integer greater than 2, from the analog input to produce an analog output;
   an integrator receiving the analog output to produce a filtered output;
   a plurality of K clocked comparators each receiving the filtered output to produce a plurality of K one bit feedback paths; and
   a poly-phase clock source of K non-overlapping phases, each of the K non-overlapping phases clocking one of the plurality of K clocked comparators and an associated switched capacitor.

2. The K-Delta-1-Sigma Modulator of claim 1 further comprising:
   a digital adder to sum the plurality of K feedback paths producing a summed digital output; and
   a digital filter receiving the summed digital output to produce a filtered digital output.

3. The K-Delta-1-Sigma Modulator of claim 1 further comprising an amplifier interposed between the integrator and the plurality of K clocked comparators.

4. The K-Delta-1-Sigma Modulator of claim 2 further comprising a digital clock source, independent of the poly-phase clock source, to clock the filtered digital output.

5. The K-Delta-1-Sigma Modulator of claim 1 further comprising a multiplexer to multiplex the K one bit feedback paths onto a single output.

6. The K-Delta-1-Sigma Modulator of claim 1 wherein the integrator is a cascaded series of integrators.

* * * * *